United States Patent
Jones et al.

(10) Patent No.: US 7,317,765 B2
(45) Date of Patent: Jan. 8, 2008

(54) SIGNAL OBSERVATION SYSTEM

(75) Inventors: Steven D. Jones, Ellicott City, MD (US); Naim M. Merheb, Ellicott City, MD (US); Jason A. Abrahamson, Baltimore, MD (US); Robert M. Shuford, Columbia, MD (US); Albert A. Tomko, New Freedom, PA (US)

(73) Assignee: The Johns Hopkins University, Baltimore, MD (US)

( * ) Notice: Subject to any disclaimer, the term of this patent is extended or adjusted under 35 U.S.C. 154(b) by 857 days.

(21) Appl. No.: 10/720,660

(22) Filed: Nov. 24, 2003

(65) Prior Publication Data
US 2005/0002449 A1    Jan. 6, 2005

Related U.S. Application Data

(60) Provisional application No. 60/429,223, filed on Nov. 26, 2002.

(51) Int. Cl.
*H04L 27/12* (2006.01)
(52) U.S. Cl. .................................... 375/305
(58) Field of Classification Search ............... 375/305, 375/224, 316; 455/62, 260, 343
See application file for complete search history.

(56) References Cited

U.S. PATENT DOCUMENTS

| | | | |
|---|---|---|---|
| 4,137,562 A | | 1/1979 | Boeck et al. |
| 4,614,909 A | | 9/1986 | Jarvfalt |
| 5,050,065 A | | 9/1991 | Dartois et al. |
| 6,313,794 B1 | * | 11/2001 | Rose .......................... 342/424 |
| 6,314,127 B1 | | 11/2001 | Lynch et al. |
| 6,356,532 B1 | | 3/2002 | Richardson et al. |
| 6,370,484 B1 | | 4/2002 | Gorin et al. |
| 6,377,617 B1 | | 4/2002 | Nara |
| 6,430,396 B1 | * | 8/2002 | Bamburak et al. ............ 455/62 |
| 2002/0055343 A1 | * | 5/2002 | Stetzler et al. .............. 455/260 |

* cited by examiner

*Primary Examiner*—Khai Tran
(74) *Attorney, Agent, or Firm*—Francis A. Cooch

(57) ABSTRACT

A system and method to modularize a signal observation process to allow continual adaptation as the independent modules evolve. Receivers, digitizers, storage, and synchronization means form discrete subsystems that can be integrated together yet still be independently upgraded or modified. The integrated system is controlled by software that allows continuous deterministic signal observation for arbitrarily long periods of time. The software enables a schedule-based temporal collection of signals through a method that controls the tuning of the receivers and the downloading of data to storage media. The control software also allows automatic distributed operation of multiple sites in synchronization to within parts per million or better.

12 Claims, 3 Drawing Sheets

SIGNAL OBSERVATION SYSTEM

CROSS REFERENCE TO RELATED APPLICATIONS

This application is related to and claims the benefit of U.S. Provisional Patent Application Ser. No. 60/429,233, filed Nov. 26, 2002.

STATEMENT OF GOVERNMENTAL INTEREST

This invention was made with Government support under Contract number MDA-972-01-D-0005 awarded by DARPA. The Government has certain rights in the invention.

BACKGROUND

For engineers working with today's emerging broadband communication systems and evolving spectrum management policies, signal analyzers are indispensable tools for research, product development, manufacturing and field-testing. Existing signal analyzers are typically monolithic systems that are geared toward real-time analysis rather than signal observation. As such, these systems are less flexible or inflexible if the system operator wishes to precisely observe multiple dimensions simultaneously. Current signal analyzers limit the ability to trade among time resolution, frequency resolution, and instantaneous bandwidth, and to extend observation periods arbitrarily. These monolithic systems are also not implemented in an automated, distributed, and synchronized manner. Many such systems are based on swept-tuned spectrum analyzers with fixed instantaneous bandwidth that require more time to monitor a given frequency band resulting in fewer observations of each spectral segment.

What is needed is a system with the ability to observe signals in multiple receiver channels using a single spectrum analyzer.

SUMMARY

The present invention is a signal observation system (SOS) for controlling a plurality of receiver channels simultaneously. The SOS can be broken down into three functional areas. The first is a setup function that analyzes the hardware configuration of the SOS to ensure that a desired observation run as represented by a frequency schedule for the receiver channels under the control of the SOS can be supported. This entails validating that the digitizers, receivers, and storage media under the control of the SOS have inherent properties such as frequency ranges, sampling rates, and settling times that are consistent with the desired observation profile set out in the frequency schedule. To that end a minimum time step parameter is calculated based on a manual input of the desired number of samples per observation. Knowing the desired number of samples per observation and the properties of the digitizers, receivers, and storage media allows a minimum time step parameter to be calculated. This is compared to the time step that is inherent in a user desired frequency schedule. If the frequency schedule time step cannot be supported by the minimum calculated time step, then the frequency schedule must be altered.

Once the frequency schedule has been validated against the SOS hardware configuration, the SOS synchronizes the receiver channels listed in the frequency schedule. This is the second function of the SOS. It is termed local synchronization and entails creating a triggering hierarchy that each receiver channel will adhere to during an observation run. Since each receiver channel operates off of the same local synchronization signal, the SOS ensures that all of the receiver channels commence and end at the same time.

A remote synchronization procedure is also possible that allows for multiple sites to participate in an observation run. Remote synchronization essentially entails slaving each site's local synchronization signal to a remote synchronization signal such as a GPS signal or the like.

The final function of the SOS is to execute the frequency schedule by generating a start signal for which each receiver channel is waiting. When the start signal is received each receiver channel kicks-off its observation run according to its specified frequency list in the frequency schedule. The receivers and digitizers are triggered according to the frequency schedule and signal observation, data digitization and data storage occur according to the parameters set out in the frequency schedule until the observation run has completed.

DETAILED DESCRIPTION

Figure 1:
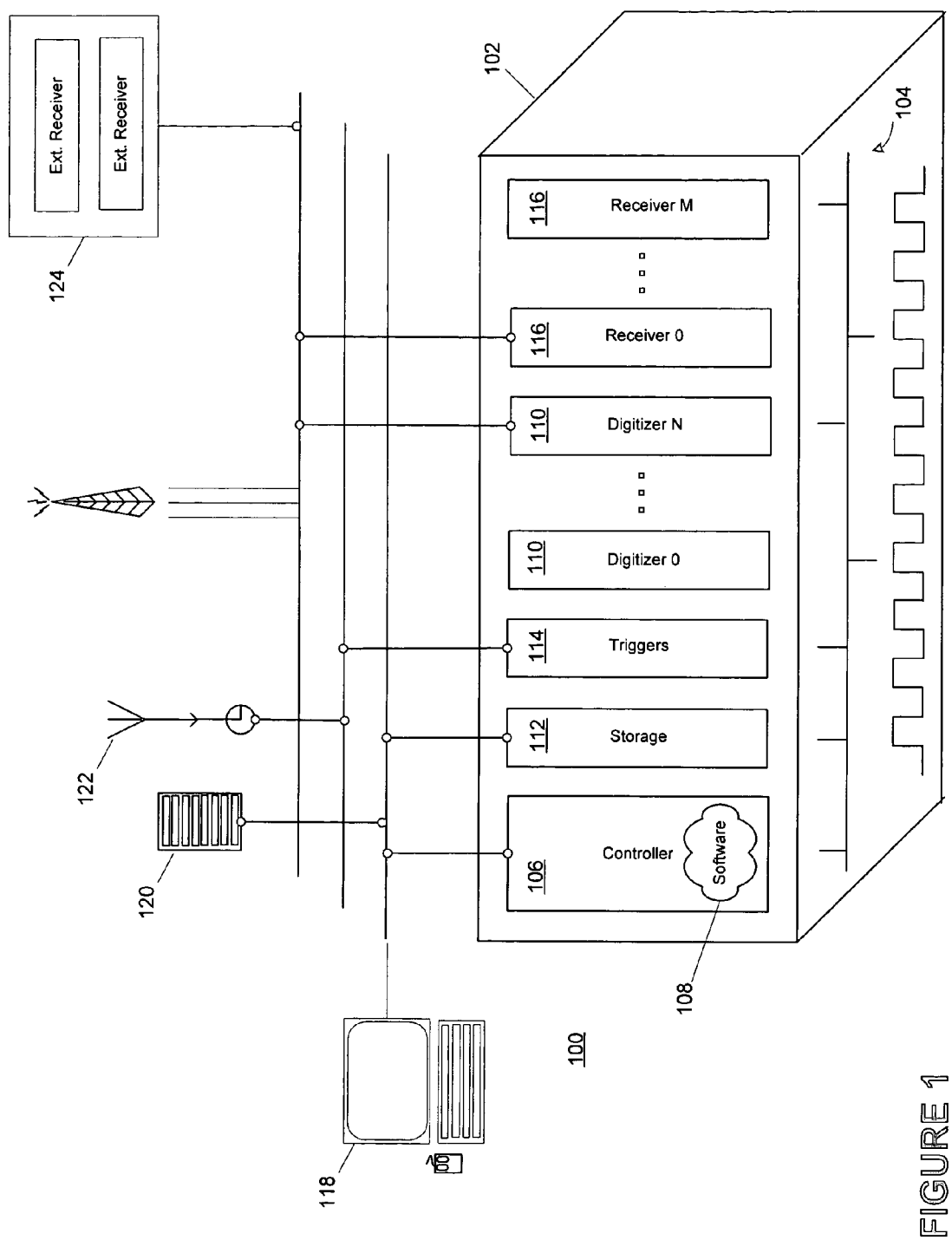
FIG. 1 is a block diagram illustrating various components that comprise the present invention.

FIG. 1 is a block diagram illustrating various components that comprise the present invention. The present invention integrates independent receivers, digitizers, storage means, synchronization means, and software control as subsystems of a signal observation system (SOS) 100. A commercial chassis 102 having a digital backplane 104 that can route data, triggers, and a common clock provides the basis for integration. A processor or controller 106 within the chassis hosts custom developed software 108 that is responsible for configuring and controlling the subsystems of the SOS. The chassis further comprises digitizers 110, storage interfaces 112, trigger generators 114, and receivers 116. A user interface (computer terminal) 118 provides the mechanism for a system operator to access and control the SOS. The receivers internal to the chassis 116 may be augmented or replaced by receivers external to the chassis 124. An external storage subsystem 120 is utilized to receive and store data from the digitizers 110. A GPS receiver 122 may provide synchronization in parts per million or better for multiple-site implementations when multiple-site simultaneous signal observation is desired. Moreover, a mechanism other than GPS can be used for this type of distributed synchronization, such as LORAN, network time services, or any user-supplied signal that is available at all sites. The GPS receiver 122 may be omitted if multiple-site synchronization is not desired.

The general mode of operation is based upon a frequency schedule that is input to the software 108. The frequency schedule controls the timing and tuning of the receiver channels. A receiver channel is comprised of a receiver 116, 124 and a digitizer 110 that are paired together. Trigger generators 114 synchronize to the common distributed synchronization signal source 122, if available, and generate a start signal.

Beginning with the start signal, the trigger generators 114 generate trains of master and slave triggers that are routed internally by backplane 104 to the internal receivers 116, digitizers 110, and externally to any external receivers 124. The slave triggers cause the receivers 116, 124 to tune to the next frequency in their respective schedules as well as cause the digitizers to download observed data to an external storage system 120. The master triggers cause the digitizers 110 to acquire more data.

The frequency schedule is a set of lists that contain the frequencies that each receiver channel will visit during each observation in a run. There is one list per receiver channel and the lists are arranged in table format with the receiver channels as headers in one dimension and sequential order in the other dimension. The values of the table are frequency values in conventional units. The lists need not be of equal length and the elements need not be distinct. TABLE 1 illustrates a sample frequency schedule with values in MHz.

| Rx Channel 0 | Rx Channel 1 | Rx Channel 2 | Rx Channel 3 | Rx Channel 4 |
|---|---|---|---|---|
| 30 | 180 | 97 | 2200 | 400 |

The SOS control software 108 loads the corresponding list from the frequency schedule to each Rx channel during setup. The software then configures the Rx channels to support stepping through their respective lists and to automatically wrap back to the beginning when the end of their lists are reached but the observation run is ongoing. Digital triggers during runtime signal the Rx channels that they should tune to the next frequency in the list or wrap around to the first frequency in the list if they are currently at the last frequency in the list. The period for these triggers is termed

TABLE 1

|   | Rx Channel 0 | Rx Channel 1 | Rx Channel 2 | Rx Channel 3 | Rx Channel 4 |
|---|---|---|---|---|---|
| 0 | 30 | 60 | 65 | 2000 | 400 |
| 1 |    | 90 | 72 | 2050 | 430 |
| 2 |    | 120 | 83 | 2100 | 460 |
| 3 |    | 150 | 89 | 2150 | 490 |
| 4 |    | 180 | 97 | 2200 | 520 |
| 5 |    | 210 |    | 2250 | 550 |
| 6 |    | 240 |    | 2300 | 580 |
| 7 |    | 270 |    | 2350 | 610 |
| 8 |    | 300 |    | 2400 |    |
| 9 |    | 330 |    | 2450 |    |

Note that the list for Rx Channel 0 contains only one element. The control software interprets that to mean that the receiver channel will be initially tuned to 30 MHz and will not be retuned throughout the entire observation run. Also note that Rx Channels 1 and 3 are the same length but that Rx Channels 2 and 4 are shorter. If this schedule were to run once completely, the lists for the shorter Rx channels would repeat automatically to make them as long as the longest list or lists in the schedule. Specifically, Rx Channel 2 would be completely repeated and Rx Channel 4 would repeat only the first two frequencies in its list. This repetition is called wrapping.

A frequency schedule can be run partially, completely, or iteratively. The input parameters for time step and duration of the observation run control that outcome. For instance, taking the example of TABLE 1 with time step parameter equal to 0.1 second, the entire frequency schedule can be completed in 1 second. This value is computed as follows:

total steps in longest list×time step=schedule duration e.g., 10 steps×0.1 second/step=1 second Then the schedule may wrap iteratively for the duration of the observation run. Using 10.5 seconds as an example duration of the observation run, Rx Channels 1 and 3 would run completely 10 times and partially once. Rx Channel 2 would run completely 21 times. Rx Channel 4 would run completely 13 times and partially once. Rx Channel 0 would always stay in its fixed frequency. The last sample gathered by this observation run would contain observations of the following frequencies (in MHz):

the time step. Such an implementation is conducive to scanning multiple frequencies very rapidly for two main reasons. First, less control data has to be transferred to the Rx channels in iterative runs because only one copy of the schedule is sent. Second, the mechanisms and buses for transfer of control data are inherently slow and more so in buses that are shared among several channels (e.g., serial, GPIB, Ethernet).

There is, however, a limit on the length of some lists in the schedule. The tunable receivers have finite memory for the registers that store their list from the frequency schedule. Some receivers support longer lists than others. A typical maximum length is 401 items (separate frequencies) as in the case of the Agilent™ E4400 signal generators that can be used as local oscillators for some of the current SOS tunable receivers in the present invention.

Using a 0.1 second time step, it is possible to revisit a 10 element list once every second. A 30 MHz channel span in that example equates to 300 MHz per second per channel. With 5 channels in that same example, the SOS could observe 1500 MHz per second. This example illustrates that the limit imposed upon the length of the lists by the receiver memory in the current SOS implementation is of little practical importance since it does not significantly constrain the observable bandwidth. There are ways of working around the memory limitation by taking advantage of the other SOS features. For instance, a very long list (e.g., >401 frequencies) can be split into shorter lists assigned to multiple channels. Alternatively, that list may be assigned to a different channel whose receiver has deeper memory and supports the frequencies of interest, as in the case of the National Instruments PXI-5600™ receivers that may also be used as tunable receivers in the present invention.

An observation run continues automatically for a pre-set time period or until it is interrupted manually by a system operator. The chief limitation of the SOS observation duration is the capacity of the storage subsystem 120. The storage subsystem 120 can be made to vary so that additional storage can be added should a particular observation run warrant more storage. The interface between the external storage subsystem 120 and the commercial chassis 102 should allow for the highest transfer rates possible to meet the requirements of the frequency schedule.

Instantaneous bandwidth refers to the band of frequencies that can be contained in a single SOS observation. SOS may have a variable number of receiver channels operating simultaneously, each contributing its individual instantaneous bandwidth. The total instantaneous bandwidth is the sum of the contributions from each receiver channel. Those contributions are governed by the characteristics of the corresponding receivers and front-ends, and by the Nyquist sampling theorem.

The Nyquist sampling theorem states that a signal limited to a band defined by a maximum frequency, the Nyquist frequency, may be uniquely determined by its samples if the sampling rate is greater than or equal to the Nyquist rate. The Nyquist rate is twice the Nyquist frequency.

Ideally, the tunable receiver and associated front-end in a receiver channel have a frequency response that is exactly as wide as half the sampling rate of their associated digitizer so that the instantaneous bandwidth is determined by Nyquist. This cannot be for it would require a perfect frequency response that is not practically attainable. The tunable receiver and front-end should then have bandwidths that are narrower than the Nyquist frequency. Otherwise, the observed signals will not be band-limited and would violate the Nyquist sampling theorem. This narrower bandwidth then drives the instantaneous bandwidth of that particular receiver channel.

The SOS is primarily designed to digitize time-domain observations (snapshots) of signals and store the observations for post-processing. This simple approach tremendously increases the utility of SOS data because the same data can be used to answer many different questions and analyze multiple dimensions with different types of processing. Some questions involve the frequency-domain characteristics of the stored observations. In particular, some questions require an answer to within a desired frequency resolution. Frequency resolution, in this context, is defined as the ability to resolve multiple narrowband signals that are closely-spaced in the frequency dimension within an observation.

Frequency resolution is, in general, inversely proportional to the time duration of an observation; finer resolution requires longer observation time, $t_O$. For instance, the observation time dictates the minimum width of the frequency bins in the Fourier spectrum of the observation. The bin widths are commonly used as an indication of frequency resolution but the ultimate resolution is a function of the actual post-processing technique. The SOS supports arbitrarily fine frequency resolutions because the user may choose to arbitrarily increase observation time for a given observation run. Observation time is an input to every SOS observation run. It is, however, specified as size measured in number of samples instead of time in seconds. Sampling rate relates the two measures as follows:

$$\text{number of samples in observation} = t_O \times \text{sampling rate}$$

Time resolution may be defined as the ability to resolve transient signals that are closely spaced in the time dimension within an observation. Note that frequency resolution is independent of the sampling rate. This is not true for the time resolution of an observation, which depends on the sampling rate used to digitize the signals. Finer time resolutions require higher sampling frequencies wherein:

$$\text{time resolution} = 1/\text{sampling rate}$$

A more interesting characteristic of the SOS is designated temporal resolution. Temporal resolution is defined in the context of the SOS as the closest achievable temporal spacing between consecutive observations. In other words, the temporal resolution is the minimum acceptable value for the SOS time step input parameter that controls the rate at which the frequency schedule is executed.

Every step of the frequency schedule requires digitizing and storing observations from each selected receiver channel. Some steps may require retuning, as in the examples of Rx Channels 1 through 4 in Table 1. Additionally, the SOS can be configured to process or display data in real-time. Each of those four processes—digitizing, storing, retuning and processing or displaying—involves some minimum time duration that may constrain the minimum time step that the SOS can support during an observation run. That minimum acceptable time step corresponds to the temporal resolution. A finer temporal resolution drives a faster iteration rate for a frequency schedule, which means a faster revisit rate for each frequency or a higher frequency advantage.

The effect that digitizing might have on the temporal resolution is dependent on the desired frequency resolution. As explained earlier, finer frequency resolution requires longer observation times. If the observation time were the constraint on the temporal resolution, finer frequency resolution would mean coarser temporal resolution. This result is rather intuitive considering the inverse proportionality between the frequency and time dimensions. However, the typical required observation times can be very short so the digitizing process does not usually drive the temporal resolution.

Observations are stored in volatile memory as they are digitized. After enough samples are collected to achieve a desired frequency resolution within an observation, the samples are transferred to more permanent storage, such as hard disk drives. This sequence of events is repeated for each step in the frequency schedule. Digitized samples from the receiver channels in use require a minimum amount of time to be transferred from volatile memory to the permanent storage. The minimum transfer time is limited by the bandwidth of the buses between volatile and permanent memory.

The SOS is designed to support long periods of autonomous observation. This requires vast permanent storage space that, coupled with the desire for modularity, points the architecture towards storage external to the chassis. There are several options for the interface between the chassis' backplane bus and the external storage. The total data generated by the SOS per unit time must be lower than the lowest bus bandwidth in order to sustain long periods of autonomous observation without eventually running out of volatile memory.

$$(\Sigma \text{observation size from each receiver channel})/\text{temporal resolution} \leq \text{bus bandwidth}$$

The relationship above is fundamental to the operation of the SOS because it defines the constraints for the trade between time resolution, frequency resolution and instantaneous bandwidth. These three performance characteristics can be roughly referenced to figures of merit in that relationship as temporal resolution, observation size and number of receiver channels, respectively.

Each type of tunable receiver has some known performance parameters, including the settling time for its local oscillators. For some receivers, the oscillator settling time is comparable to the aforementioned minimum transfer time. Thus, the settling time may impose the lower bound on the supportable time step. The control software in SOS verifies that the selected receivers can support the input time step.

Local synchronization allows the receivers, digitizers and storage to operate in an orderly, deterministic manner that enables the performance required by each particular observation run. The tunable receivers need time for their local oscillators to settle, the digitizers need to gather signal for a minimum duration in order to achieve the requested frequency resolution, and the backplane bus and storage subsystem have limited bandwidth that needs to be continuously shared by the observations from all channels. Those three physical constraints impact the lowest supportable time step parameter, which corresponds to the highest supportable revisit rate for an observation run.

The local synchronization is implemented via a set of software and hardware triggers and clocks configured by the control software for every observation run. Synchronization is a key element of the SOS design. There can be remote synchronization among distributed sites for applications involving coordinated spectral monitoring over an extended area geolocation or spatial resolution, in addition to local synchronization.

Figure 2:
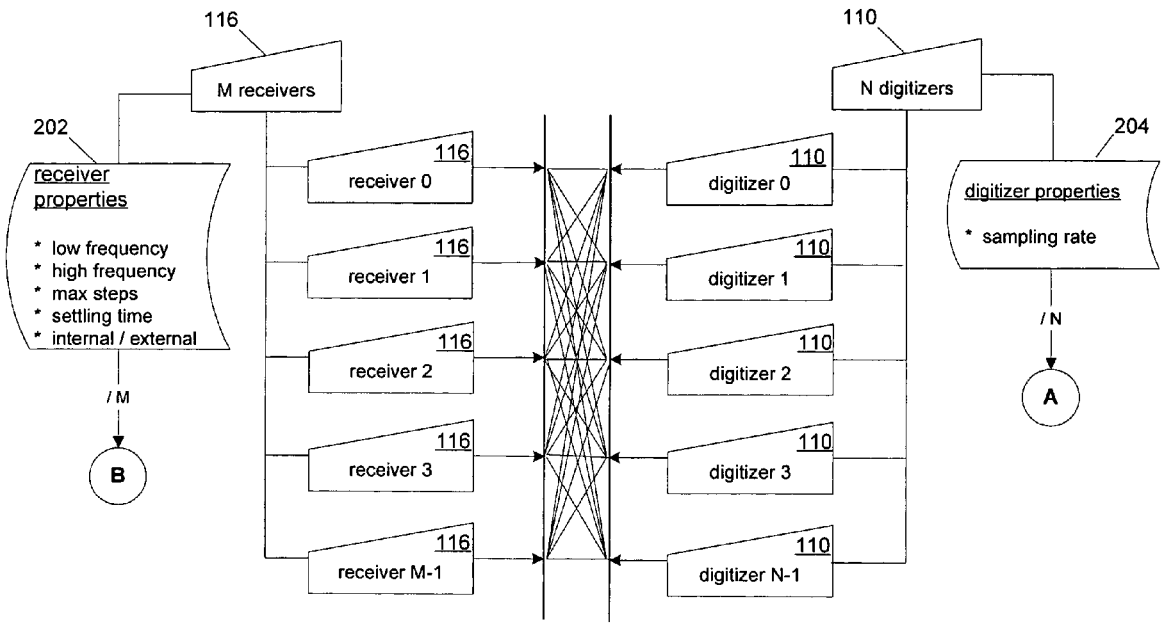
FIG. 2 illustrates the possibilities in channel assignment and digitizer/receiver pairing.

FIG. 2 illustrates potential digitizer/receiver pairings, also termed receiver channels or Rx channels. There are M receivers 116, 124 and N digitizers 110. Each of the receivers 116, 124 possesses individual properties 202 that define its capabilities. Such properties include the lowest and highest tunable frequencies, the maximum supportable number of frequency steps (based on the aforementioned memory limitations), an oscillator settling time when re-tuning to another frequency, and whether the receiver is an internal or external receiver. Similarly the digitizers 110 possess properties 204 such as sampling rate. FIG. 2 illustrates that the receivers 116, 124 and digitizers 110 can be paired in an any-to-any 117 fashion meaning any receiver 116, 124 can be paired with any digitizer 110. The receiver properties 202 for each receiver 116, 124 as well as the digitizer properties 204 for each digitizer 110 and the receiver channel pairings 117 are forwarded to the SOS control software.

Figure 3:
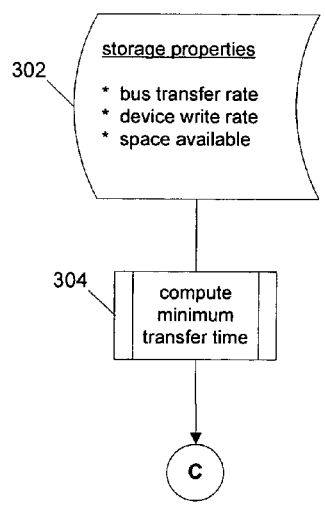
FIG. 3 illustrates storage considerations for the SOS.
Figure 4:
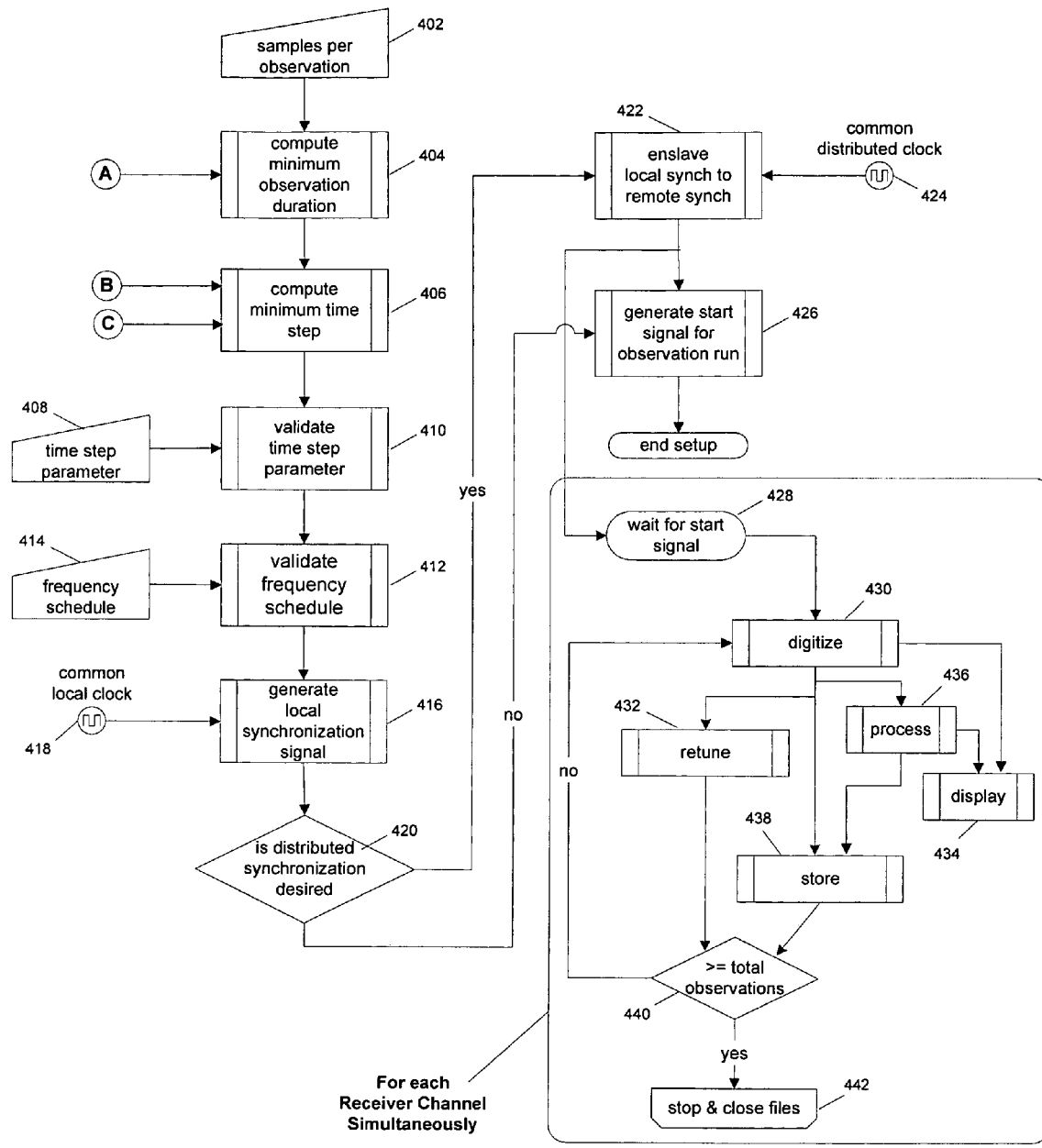
FIG. 4 illustrates the main processes that the control software uses to configure and execute an observation run.

FIG. 3 illustrates storage considerations for the SOS. The storage devices that will record observed data are characterized by storage properties 302. Storage properties 302 include characteristics such as bus transfer rate, device write rate, and available space. These characteristics impact the time step parameter that can be supported in an observation run. The storage properties 302 are input to a 'compute minimum transfer time process' 304 that computes the minimum transfer time needed by the storage unit to accomplish its task FIG. 4 illustrates the main processes that the control software uses to configure and execute an observation run. The process begins with a system operator manually inputting a 'desired samples per observation' parameter 402. This parameter is input to a 'compute minimum observation duration process' 404. The compute minimum observation duration process 404 also receives as input the digitizer properties (sampling rate) from FIG. 2. The minimum observation duration is calculated for each Rx channel as (samples per observation/sampling rate).

This new parameter is input to a 'compute minimum time step process' 406. The compute minimum time step process 406 also receives as input the receiver properties 202 from FIG. 2 and the minimum transfer time from 304 in FIG. 3. The minimum time step is calculated as (minimum observation duration+minimum transfer time) or (minimum observation duration+minimum settling time), whichever is greater. The minimum transfer time is obtained from the storage properties while the minimum settling time is obtained from the receiver properties. Once the SOS minimum supportable time step has been calculated, it is compared against a manually input 'time step parameter' 408 input by a system operator. This is a 'time step validation process' 410 to ensure that the system operator has not input a time step parameter smaller than the calculated minimum time step that cannot be supported by the SOS.

The desired frequencies of an observation run are also subjected to a 'validation process' 412. A desired 'frequency schedule per receiver channel' is manually input 414 to the validation process 412. The frequency schedule is comprised of a set of frequencies to be visited in an observation run. Thus, there is a minimum or low frequency, a maximum or high frequency, and a total number of frequencies in each schedule. To validate each frequency schedule for its corresponding receiver, three checks are performed. In no particular order, the receiver property 'max steps' must be≧the total number of frequencies in its schedule, the receiver property 'low frequency' must be≦the lowest frequency in the list, and the receiver property 'high frequency' must be≧the highest frequency in the list.

Once the manually input desired parameters have been validated against the equipment to be used in the observation run, then a 'generate local synchronization process' 416 occurs with the aid of a common local clock 418. The purpose of local synchronization is to allow the digitizers, receivers, and storage to operate in an orderly, deterministic manner that enables the performance required by a given observation run. The tunable receivers need time for their local oscillators to settle. The digitizers need to gather signal information for a minimum duration to achieve the desired frequency resolution. And, the storage subsystem has limited bandwidth that needs to be continuously shared by the observations from all Rx channels. It is the combination of the aforementioned three constraints that impact and determine the lowest supportable time step parameter that corresponds to the highest supportable re-visit rate for an observation run. The time step is defined as the period between digitizer triggers. The observation duration maps to the time between the leading edge of a digitizer trigger and its corresponding leading edge of a receiver/storage trigger. The observation duration is necessarily shorter than the time step leaving time for the digitized data to be received and stored within the overall time step duration.

If applicable, a distributed synchronization process can be implemented for applications involving coordinated spectral monitoring over an extended area geolocation or spatial resolution. The software determines 420 if distributed synchronization is desired. If so, the local synchronization is enslaved to the remote synchronization 422 with the aid of a common distributed clock 424 such as one derived from the GPS system.

Essentially, there are two aspects to generating a local synchronization signal: clock and triggers. By clock it is meant that the circuitry on each component is instructed to lock its individual clock to the common clock supplied by the SOS. That means that all devices will listen and respond to the trigger edges synchronically. It also means that the sampling clocks on the digitizers are close enough to the common clock and each other that the individual samples within an observation are synchronized to within parts per billion across all channels. The ability to enslave to an external clock is incorporated into most commercial receivers.

As stated earlier, there is a master and a slave trigger. However, there actually may be multiple slave triggers depending on the frequency schedule. Consider, for example, a frequency schedule for a particular channel that calls for retuning every other step. In this case, there is a slave trigger that triggers on every other master trigger. Several other channels in that same observation run may retune on every step. In this case, there is a slave trigger that triggers on every master trigger. There may be yet another channel that never retunes. This channel may be thought of as having no slave trigger. The receivers supporting the frequency schedule in this example required three distinct slave trigger configurations. To achieve the goals of the frequency schedule, the local synchronization 416 process also receives a copy of the frequency schedule as an input to generate the trigger hierarchy involving master and slave triggers for each receiver channel. It determines how many different slave triggers the schedule is going to need and the appropriate channels to which the triggers should be routed.

When remote synchronization is employed, the start signal, or initial trigger, 426 is linked to the signal that is coming from the external source (e.g., GPS pulse per second). When remote synchronization is not employed, the start signal 426 is generated arbitrarily. Another advantage of remote synchronization is the potential for a common distributed clock 424. SOS has the option of locking the common local clock 418 to the remote clock. That makes the samples within an observation concurrent to within parts per million or better across all channels in all the sites, not just within the local site.

Once the local synchronization is tied to the remote synchronization the next process is to generate a start signal 426 and simultaneously begin waiting for the start signal 428. If remote synchronization was not requested then control would go directly to the 'generate start signal process' 426 once local synchronization 416 was completed. The start signal also signifies the end of SOS setup and the commencement of an observation run. The activity that occurs during an observation run occurs simultaneously for each receiver channel. That is, each receiver channel is observing, digitizing, and storing data at the same time albeit for different frequencies and lengths of time based on their own specific frequency list in the frequency schedule. The frequency schedule does guarantee, however, that the observation run will commence and end at the same time for each receiver channel and site.

When the start signal occurs, that signals the digitizers to trigger 430 and digitize observed signals. When that iteration of digitization has completed, the receivers either retune 432 to the next frequency in their frequency schedule or remain on their current frequency depending on the status of the frequency schedule. In addition, the raw digitized data can be displayed 434, processed 436 then stored 438, or processed 436 then displayed 434, or the raw digitized data can be stored 438. One way or another, however, the digitized data will be stored. These choices are user selectable but will have an impact on SOS performance. Avoiding processing and/or displaying in real-time will allow the SOS to perform at peak levels since there is no additional drain on computing resources. Judicious application of real-time processing and/or displaying of digitized data can be done without dramatically affecting the performance of the SOS during a given observation run.

Once post digitization activity is complete, a check is made to see if the observation run is over 440 based on whether the current number of observations meets or exceeds the requested total number of observations. If not, control is returned to the digitizers so that the next observation can occur. If the observation run has completed, processing stops and the storage files are closed 442.

The present invention has been described, in part, with reference to flowcharts or logic flow diagrams. It will be understood that each block of the flowchart diagrams or logic flow diagrams, and combinations of blocks in the flowchart diagrams or logic flow diagrams, can be implemented by computer program instructions.

These computer program instructions may be loaded onto a general purpose computer, special purpose computer, or other programmable data processing apparatus to produce a machine, such that the instructions that execute on the computer or other programmable data processing apparatus create means for implementing the functions specified in the flowchart block or blocks or logic flow diagrams.

These computer program instructions may also be stored in a computer-readable memory that can direct a computer or other programmable data processing apparatus to function in a particular manner, such that the instructions stored in the computer-readable memory produce an article of manufacture including instruction means which implement the function specified in the flowchart blocks or logic flow diagrams. The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions specified in the flowchart blocks or logic flow diagrams.

Accordingly, block(s) of flowchart diagrams and/or logic flow diagrams support combinations of means for performing the specified functions, combinations of steps for performing the specified functions and program instruction means for performing the specified functions. It will also be understood that each block of flowchart diagrams and/or logic flow diagrams, and combinations of blocks in flowchart diagrams and/or logic flow diagrams can be implemented by special purpose hardware-based computer systems that perform the specified functions or steps, or combinations of special purpose hardware and computer instructions.

In the following claims, any means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

The invention claimed is:

1. A signal observation system (SOS) for controlling a plurality of receiver channels simultaneously, the receiver channels comprised of tunable receivers and digitizers in a hardware configuration, wherein the tunable receivers and digitizers possess inherent properties that define their respective capabilities, the SOS comprising:

a processor readable storage medium;

code recorded in the processor readable storage medium to process a frequency schedule that defines an observation run, the frequency schedule being comprised of a set of lists, each list corresponding to a separate receiver channel, the lists comprised of a plurality of frequencies that define the frequencies each receiver channel is to observe during execution of the observation run and how long to observe each frequency before re-tuning to the next frequency in the list;

code recorded in the processor readable storage medium to generate a local synchronization signal that defines a triggering hierarchy that each receiver channel will reference during the observation run; and code recorded in the processor readable storage medium to generate a start signal that is broadcast to the receiver channels that initiates an observation run that binds each receiver channel to the frequency schedule.

2. The signal observation system (SOS) of claim 1 further comprising:

code recorded in the processor readable storage medium to ensure that a user input time step parameter can be supported by the hardware configuration of the SOS based on a computed minimum time step parameter derived from the inherent properties of the receiver channels.

3. The signal observation system (SOS) of claim 1 further comprising:

code recorded in the processor readable storage medium to ensure that the frequency schedule does not contain frequencies outside the frequency range supportable by the receiver channels as defined by the inherent properties of their respective tunable receivers.

4. The signal observation system (SOS) of claim 1 wherein the local synchronization signal is enslaved to a remote synchronization signal to permit a multiple site SOS implementation that ensures that each site is synchronized to the others and is executing its observation run based on a remote clock signal common to all sites.

5. The signal observation system (SOS) of claim 4 wherein the remote synchronization signal is obtained from a GPS signal.

6. A signal observation system (SOS) for controlling a plurality of receiver channels simultaneously, the SOS comprising:

a plurality of digitizers individually coupled with a plurality of tunable receivers forming a plurality of receiver channels such that each receiver channel can be tuned to a variety of frequencies so as to observe and digitize signals into digitized data;

storage means to receive and store digitized data observed by said receiver channels;

triggering means to control the tuning of the receivers and the timing of the digitizers; and a processor coupled via a digital backplane with the digitizers, receivers, storage means, and triggering means to control the actions of the digitizers, receivers, storage means, and triggering means based on a user supplied frequency schedule.

7. The signal observation system (SOS) of claim 6 wherein the frequency schedule defines an observation run, the frequency schedule being comprised of a set of lists, each list corresponding to a separate receiver channel, the lists comprised of a plurality of frequencies that define the frequencies each receiver channel is to observe during execution of the observation run and how long to observe each frequency before re-tuning to the next frequency in the list.

8. A method of controlling a plurality of receiver channels simultaneously, the receiver channels comprised of a tunable receivers and digitizers in a hardware configuration, wherein the tunable receivers and digitizers possess inherent properties that define their respective capabilities, the method comprising:

processing a frequency schedule that defines an observation run, the frequency schedule being comprised of a set of lists, each list corresponding to a separate receiver channel, the lists comprised of a plurality of frequencies that define the frequencies each receiver channel is to observe during execution of the observation run and how long to observe each frequency before re-tuning to the next frequency in the list;

generating a local synchronization signal that defines a triggering hierarchy that each receiver channel will follow during the observation run; and generating a start signal that is broadcast to the receiver channels that initiates an observation run that binds each receiver channel to the frequency schedule.

9. The method of claim 8 further comprising:

ensuring that a user input time step parameter can be supported by the hardware configuration of the receiver channels based on a computed minimum time step parameter derived from the receiver and digitizer inherent properties.

10. The method of claim 8 further comprising:

ensuring that the frequency schedule does not contain frequencies outside the frequency range supportable by the receiver channels as defined by the inherent properties of their respective tunable receivers.

11. The method of claim 1 wherein the local synchronization signal is enslaved to a remote synchronization signal to permit a multiple site SOS implementation that ensures that each site is synchronized to the others and is executing its observation run based on a remote clock signal common to all sites.

12. The method of claim 11 wherein the remote synchronization signal is obtained from a GPS signal.

* * * * *